United States Patent [19]
Fitzpatrick et al.

[11] Patent Number: 5,949,357
[45] Date of Patent: Sep. 7, 1999

[54] TIME-VARYING MAXIMUM-TRANSITION-RUN CODES FOR DATA CHANNELS

[75] Inventors: Kelly K. Fitzpatrick, Mountain View; Cory Modlin, Palo Alto, both of Calif.

[73] Assignee: Quantum Corporation, Milpitas, Calif.

[21] Appl. No.: 08/782,182

[22] Filed: Jan. 13, 1997

[51] Int. Cl.$^6$ ................................................ H03M 7/00
[52] U.S. Cl. ............................................. 341/68; 341/59
[58] Field of Search ................................. 341/59, 58, 50, 341/93, 94, 82

[56] References Cited

U.S. PATENT DOCUMENTS 5,731,768   3/1998   Tsang ........................................ 341/59

OTHER PUBLICATIONS

B. Marcus and P. Siegel, "Constrained Codes for PRML" *Research Report*, RJ 4371 (47629) Jul. 31, 1984 IBM Research Div., IBM Corporation, 68 pages.

J. Moon and B. Brickner, "Maximum Transition Run Codes for Data Storage Systems", *1996 Digests of Intermag '96*, HB–10, Apr. 1996, 3 pages.

R. Karabed and P. Siegel, "Coding for Higher Order Partial Response Channels", *SPIE*, vol. 2605, 1996, pp. 115–126.

P. Siegel and J. Wolf, "Modulation and coding for Information Storage", *IEEE Communications Magazine*, Dec. 1991, pp. 68–86.

*Primary Examiner*—Brian Young
*Attorney, Agent, or Firm*—David B. Harrison

[57] ABSTRACT

A data channel, such as a magnetic recording/playback channel implements a time-varying maximum-transition-run code such that the code allows three consecutive transitions while it removes a dominant plus-minus-plus error-event and does not permit of four or more consecutive transitions.

20 Claims, 4 Drawing Sheets

The MTR constraint graph with capacity 0.8792 using NRZI notation.

Time-varying MTR constraint graph with capacity 0.9162 using NRZI notation.

Time-varying MTR trellis with period 2.

Time-varying MTR constraint graph with capacity 0.9032 using NRZI notation.

Time-varying MTR trellis with period 3.

The time-varying MTR trellis for the rate 8/9 block code.

The time-varying part of a 16-state detector trellis.

TIME-VARYING MAXIMUM-TRANSITION-RUN CODES FOR DATA CHANNELS

FIELD OF THE INVENTION

The present invention relates to coding for data channels. More particularly, the present invention relates to a time-varying maximum transition run code for a magnetic recording and playback channel employing sampled data detection.

BACKGROUND OF THE INVENTION

Partial response channels which are well matched to a magnetic recording channel at low normalized densities are dominated by error-events involving a single channel symbol error, where the channel symbol represents the polarity of a write current +1 or −1. In partial response channels that are well matched to the magnetic recording channel at high transition densities, a different error-event is dominant. This dominant error-event involves three channel symbol errors which correspond to mistaking e.g. a channel symbol sequence of +1 −1 +1 for −1 +1 −1, or vice versa.

Coding is used to achieve improved performance of partial response channels. After characterizing a magnetic recording partial response channel, a list of dominant error-events is compiled. Then, a code is designed so that it does not contain any two sequences that are separated by a single error-event in the list. Merely constraining the sequences to a given coding constraint is not enough to obtain a significant coding gain. Rather, a Viterbi detector which is matched to the combination of the channel and the code must be used to insure that the detected sequence is allowed by the constraint.

Run-length limited codes that eliminate consecutive transitions have been suggested for high density magnetic recording. These codes are typically referred to as d=1 codes. By removing consecutive transitions, the +1 −1 +1 and −1 +1 −1 write current sequences are not allowed. Therefore, the dominant error-event at high densities is removed along with many other likely error-events. Because the code reduces the number of transitions and increases the spacing between transitions, magnetic write precompensation can be more accurately performed, leading to a reduction in non-linear transition shift. The most common of these codes is a rate 2/3 (d=1, k=7) code that has previously been used in magnetic recording channels employing peak detection techniques. More recently, a rate 4/5 code that removes the same error-events in an $E^2PR4$ magnetic recording channel has been proposed, R. Karabed and P. Siegel, "Coding for Higher Order Partial Response Channels", SPIE, Vol. 2605, 1996, pp. 115–126.

To achieve higher rates than are possible with a d=1 code, maximum transition ("MTR") codes that permit two, but not three, consecutive transitions have been suggested, and a plurality of MTR codes including a rate 16/19 (d=0, k=7) MTR block code have been proposed by J. Moon and B. Brickner in "Maximum Transition Run Codes for Data Storage Systems", 1996 Digests of Intermag '96, HB-10, April 1996, 3 pages. Their basic idea is to eliminate certain input bit patterns that would cause most error-events in a sequence detector. More specifically, the write current sequences in the proposed MTR code are not allowed to contain +1 −1 +1 or −1 +1 −1. There are only four possible ways of getting the dominant error-event at high linear densities. These four ways correspond to mistaking the following write current sequences, one for the other and conversely:

| CASE 1. | +1 +1 −1 +1 +1 | 2 consecutive transitions |
|---|---|---|
|  | +1 −1 +1 −1 +1 | 4 consecutive transitions |
| CASE 2. | −1 +1 −1 +1 −1 | 4 consecutive transitions |
|  | −1 −1 +1 −1 −1 | 2 consecutive transitions |
| CASE 3. | −1 +1 −1 +1 +1 | 3 consecutive transitions |
|  | −1 −1 +1 −1 +1 | 3 consecutive transitions |
| CASE 4. | +1 +1 −1 +1 −1 | 3 consecutive transitions |
|  | +1 −1 +1 −1 −1 | 3 consecutive transitions. |

The idea of MTR coding is to eliminate three or more consecutive transitions, but allow the dibit pattern in the written magnetization waveform. Since at least one sequence in each of these four cases contains three or more consecutive transitions, the MTR code satisfies the condition that no two coded sequences are separated by the dominant high density error-event. With the MTR constraint, precompensation can be performed more accurately (i.e., mainly directed to dibit transitions), leading to a reduction in non-linear transition shift, but not as much of a reduction as can be obtained with a d=1 code that contains only isolated transitions.

The nomenclature used to represent the write current sequence is referred to as "non-return-to-zero" or "NRZ" notation. The number of states in the MTR constraint graph is cut in half by using "non-return-to-zero-inverse" or "NRZI" notation, where a zero corresponds to no transition, and a one corresponds to a transition. In NRZI notation the code constraint forbids the 111 sequence, which corresponds to the write current sequences +1 −1 +1 −1 and −1 +1 −1 +1. The MTR constraint graph is shown in FIG. 1 using NRZI notation.

Shannon's theorem states that it is possible, in principle, to devise a mechanism whereby a channel will transmit information with an arbitrarily small probability of error provided that the information rate is less than or equal to a rate called "channel capacity" or C. The Shannon channel capacity of a constraint graph is the logarithm base 2 of the largest real eigen value of the state transition matrix. The capacity of the FIG. 1 graph determines an upper bound on the maximum rate of a code satisfying that constraint. From the state transition matrix in Equation 1, the MTR constraint has a channel capacity C=0.8792.

$$\begin{bmatrix} 110 \\ 101 \\ 100 \end{bmatrix} \quad (1)$$

In general, the MTR constraint that allows at most two transitions in a row removes branches and/or states from the Viterbi detector for the channel. Therefore, an MTR code provides coding gain at high densities without adding complexity to the system. In a 16-state Viterbi detector, states +1 −1 +1 −1 and −1 +1 −1 +1 are simply removed, leaving only 14 states in the detector trellis. In an 8-state Viterbi detector states +1 −1 +1 and −1 +1 −1 each have only one branch entering and one branch leaving.

While MTR codes provide coding gain without adding complexity, a hitherto unsolved need has remained for a new type of modulation code for high density magnetic recording having a higher rate than the prior MTR block codes described by Moon and Brickner, for example, and without significantly increasing system complexity.

SUMMARY OF THE INVENTION WITH OBJECTS

A general object of the present invention is to implement and use a time-varying maximum-transition-run ("TMTR")

code within a data channel wherein the code allows three consecutive transitions while removing a dominant plus-minus-plus error-event and wherein the code does not permit four or more consecutive transitions.

Another more specific object of the present invention is to provide TMTR codes for high density magnetic recording which overcome limitations and drawbacks of the prior approaches.

One more object of the present invention is to provide a modulation code for a high linear density magnetic recording/playback channel which has a higher channel capacity than achieved with prior MTR block codes, and without significant increase in detector complexity.

Another object of the present invention is to provide a rate 8/9 (d=0, k=11) TMTR code and implement encode/decode and detector circuitry for a magnetic recording and playback channel.

A further object of the present invention is to provide a rate 8/9 (d=0, G=13, I=9) TMTR code and implement encode/decode and detector circuitry for a magnetic recording and play back channel.

In one aspect of the present invention a data channel such as a magnetic recording and playback channel implements and uses a TMTR code that allows up to three consecutive transitions while removing a plus-minus-plus error-event and which does not permit four or more consecutive transitions.

In another aspect of the invention a magnetic recording and playback channel includes an encoder for encoding a binary data block to be recorded into encoded data code words in accordance with a predetermined time-varying maximal-transition-run code that allows up to three consecutive magnetic flux transitions while removing a plus-minus-plus error-event and which does not allow four or more consecutive magnetic flux transitions, a precoder and a write driver for converting encoded data code words into a write current sequence, and a write element for converting the write current sequence into a magnetic flux pattern on a magnetic storage medium moving relatively to the write element. Within this aspect of the invention the channel may further include a playback element for detecting the magnetic flux pattern on the magnetic storage medium as a minute electrical signal, an analog read channel for amplifying and equalizing to a desired spectrum the minute electrical signal to provide an amplified electrical signal, a sampler for synchronously sampling the amplified electrical signal to produce discrete data samples, a time varying detector for detecting maximum likelihood code sequences from the discrete data samples in accordance with the predetermined time-varying maximal-transition-run code, a postcoder and a decoder for decoding the output of the detector The predetermined time-varying maximal-transition-run code is a rate 8/9 block code which may have constraint (d=0, k=11) or constraint (d=0, G=13, I=9), for example.

These and other objects, advantages, aspects and features of the present invention will be more fully understood and appreciated by those skilled in the art upon consideration of the following detailed description of a preferred embodiment, presented in conjunction with the accompanying drawings.

DETAILED DESCRIPTION OF PREFERRED EMBODIMENTS

The present invention provides channel codes with high rate than an MTR code that remove the same error-events as an MTR code. The new code constraint forbids all write current sequences with four or more consecutive transitions and forbids three transitions to end at consecutive time periods. Forbidding all sequences with four or more transitions ensures that the code does not include one of the two sequences in CASE 1 and CASE 2, presented hereinabove. In CASE 3 and CASE 4, the three transitions in a row end at consecutive time periods, as follows:

CASE 3.  −1 +1 −1 $\underline{+1}$ +1  3 consecutive transitions ending at time j
         −1 −1 +1 −1 $\underline{+1}$  3 consecutive transitions ending at time j + 1
CASE 4.  +1 +1 −1 +1 $\underline{-1}$  3 consecutive transitions ending at time j + 1
         +1 −1 +1 $\underline{-1}$ −1  3 consecutive transitions ending at time j.

Therefore, the constraint that three transitions in a row cannot end at consecutive time periods eliminates one of the two sequences in CASES 3 and 4.

One example of a time-varying MTR constraint that allows three transitions to end in every other time period has a capacity of C=0.9162. The state transition matrix for this MTR constraint is given in Equation 2, as follows:

$$\begin{bmatrix} 0011 \\ 0010 \\ 2000 \\ 1100 \end{bmatrix} \quad (2)$$

Figure 1:
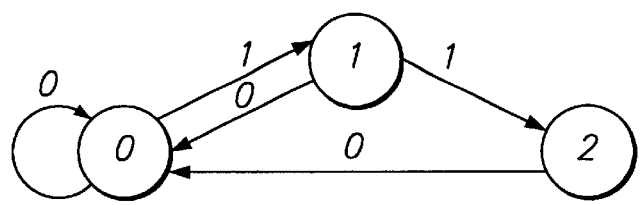
FIG. 1 is a constraint graph of the rate 16/19 (d=0, k=7) MTR block code of the prior art, using NRZI notation.
Figure 2:
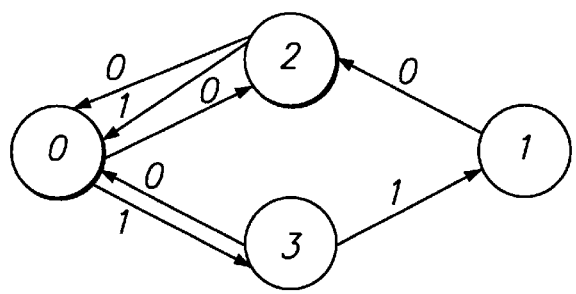
FIG. 2 is a constraint graph of a time-varying MTR block code with capacity 0.9162, using NRZI notation.
Figure 3:
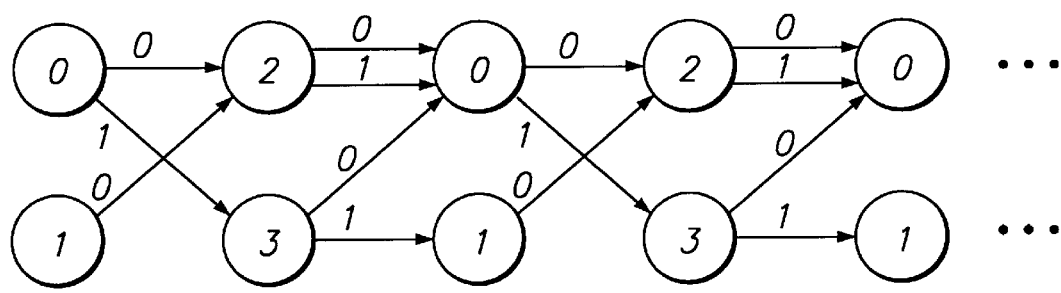
FIG. 3 is a time-varying trellis diagram of period 2 for the FIG. 2 time-varying MTR block code.

A constraint graph implementing the Equation 2 matrix is shown in FIG. 2 using NRZI notation. The time-varying trellis that arises from the FIG. 2 constraint graph is periodic, having a period 2, as shown in FIG. 3. Unfortunately, it is not possible to make a rate 8/9 block code from this constraint. The constraint graph does not include 256 words of length 9 that can be freely concatenated, mainly because of the even periodicity of the trellis and the odd block length.

Another example of a time-varying MTR constraint that allows three transitions to end at every third time period has a capacity of C=0.9032. The state transition matrix is shown in Equation 3, as follows:

$$\begin{bmatrix} 0011000 \\ 0010000 \\ 0000110 \\ 0000101 \\ 2000000 \\ 1100000 \\ 1000000 \end{bmatrix} \quad (3)$$

Figure 4:
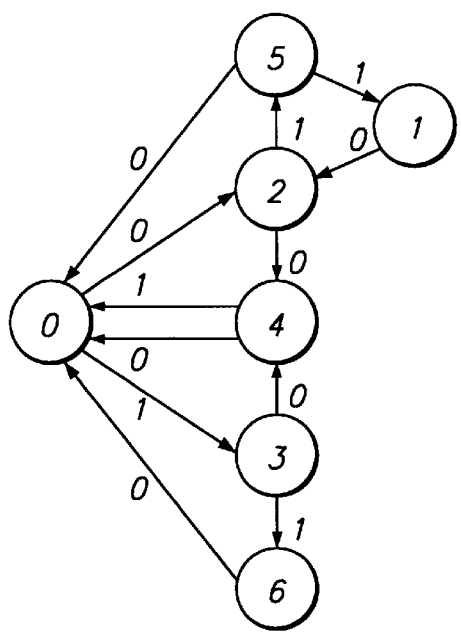
FIG. 4 is a constraint graph of a time-varying MTR block code with capacity 0.9032, using NRZI notation.
Figure 5:
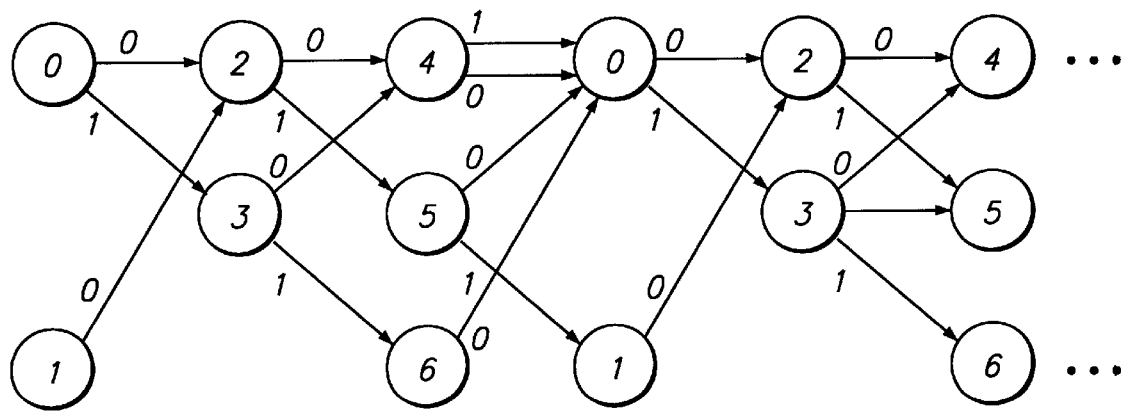
FIG. 5 is a time-varying trellis diagram of period 3 for the FIG. 4 time-varying MTR block code.

A constraint graph implementing the Equation 3 matrix is shown in FIG. 4. A time-varying trellis arising from the Equation 3 matrix, shown in FIG. 5, is periodic with period 3. The concatenation issue is solved, since the block length 9 is a multiple of the period (3). However, after raising the state transition matrix in Equation 3 to the power 9, there are only 255 words than can be concatenated, rather than a required 256 words.

Figure 6:
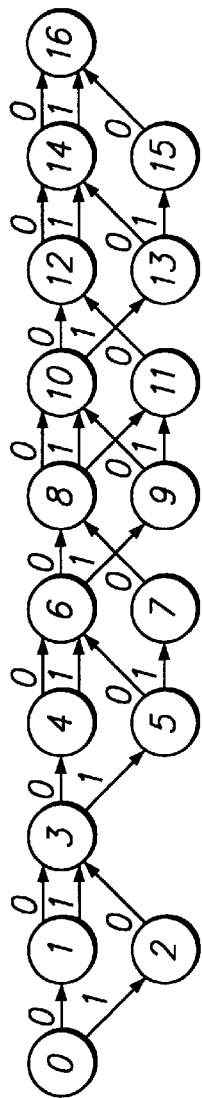
FIG. 6 is a time-varying MTR trellis for a rate 8/9 block code in accordance with the invention.

In order to form a rate 8/9 time-varying MTR block code in accordance with principles of the present invention, the properties of the period 2 and period 3 constraint graphs (FIGS. 2 and 4, respectively) are combined. The time-varying MTR trellis with period 9 shown in FIG. 6 contains 267 words, starting in state 0 and ending in state 0. The time-varying MTR constraint is satisfied becaused four consecutive 1's are not allowed and three consecutive 1's can only end at states 2, 7, 11, and 15, which are all separated in time by at least one time period, even when concatenated. The FIG. 6 trellis allows words to end with at most two consecutive 1's and to begin with at most a single 1. The state transition matrix in accordance with FIG. 6 is shown in Equation 4, as follows:

$$\begin{bmatrix} 0110000000000000 \\ 0002000000000000 \\ 0001000000000000 \\ 0000110000000000 \\ 0000002000000000 \\ 0000001100000000 \\ 0000000011000000 \\ 0000000010000000 \\ 0000000000200000 \\ 0000000000110000 \\ 0000000000001100 \\ 0000000000001000 \\ 0000000000000020 \\ 0000000000000011 \\ 2000000000000000 \\ 1000000000000000 \end{bmatrix} \quad (4)$$

In magnetic recording a modulation code is required to ensure that transitions occur frequently, so that timing loops and gain loops can operate properly. A rate 8/9 time-varying MTR block code following the Equation 4 state transition matrix has been found with a (d=0, k=11) run-length constraint, which limits the maximum number of consecutive zeros to 11. After preceding with a 1/(1+D)(mod 2) precoder, there are at most 12 consecutive write current symbols of the same polarity. Therefore, transitions are separated by at most 12 channel clock cycles. Out of the 267 words in FIG. 6, nine violate the (d=0, k=11) constraint. The 256 words needed for the block code are selected from the 258 other words that satisfy the time-varying MTR constraint and the (d=0, k=11) run-length constraint.

In the 258 other words, there are four words with a single 1 in them. since these words have only a single transition, it is desirable to remove them from the code (to maintain robustness of the gain and timing loops as mentioned above). Therefore, two of the four single transition words are not included in the 256 word code. Table 1 appended hereto shows the mapping from input bytes to code words for a presently preferred rate 8/9 time-varying MTR block code.

A code mapping table for encoder mapping of input binary words (hexadecimal) to three byte code words (hexadecimal) for the exemplary rate 8/9 (d=0, k=11) TMTR block code discussed hereinabove:

Time-varying MTR codes ("TMTR code") require a time-varying Viterbi detector. Like an MTR code, the TMTR code does not add significant complexity to the detector, since it only removes states and/or branches from the detector trellis. In a 16 state Viterbi detector the states 10=+1 +1 −1 and 5=−1 +1 −1 +1 are removed from the detectfor those time periods that do not allow three transitions. Removing these states in a time-varying manner can be implemented in the selection circuit within the add-compare-select units for four states. The selection circuit for state 10 is modified to always select the path from state 13=+1 +1 −1 +1. Similarly, the selection circuit for state 5 is modified to always select the path from state 2=−1 −1 +1 −1. The selection circuit for state 11=+1 −1 +1 +1 is modified to select the path from state 13 if three transitions were not allowed to end during the previous time period, and otherwise to select the path with the minimum metric. Similarly, the selection circuit for state 4=−1 +1 −1 −1 is modified to select the path from state 2 if three transitions are not allowed to end during the previous time period, and otherwise to select the path with the minimum metric.

Figure 7:
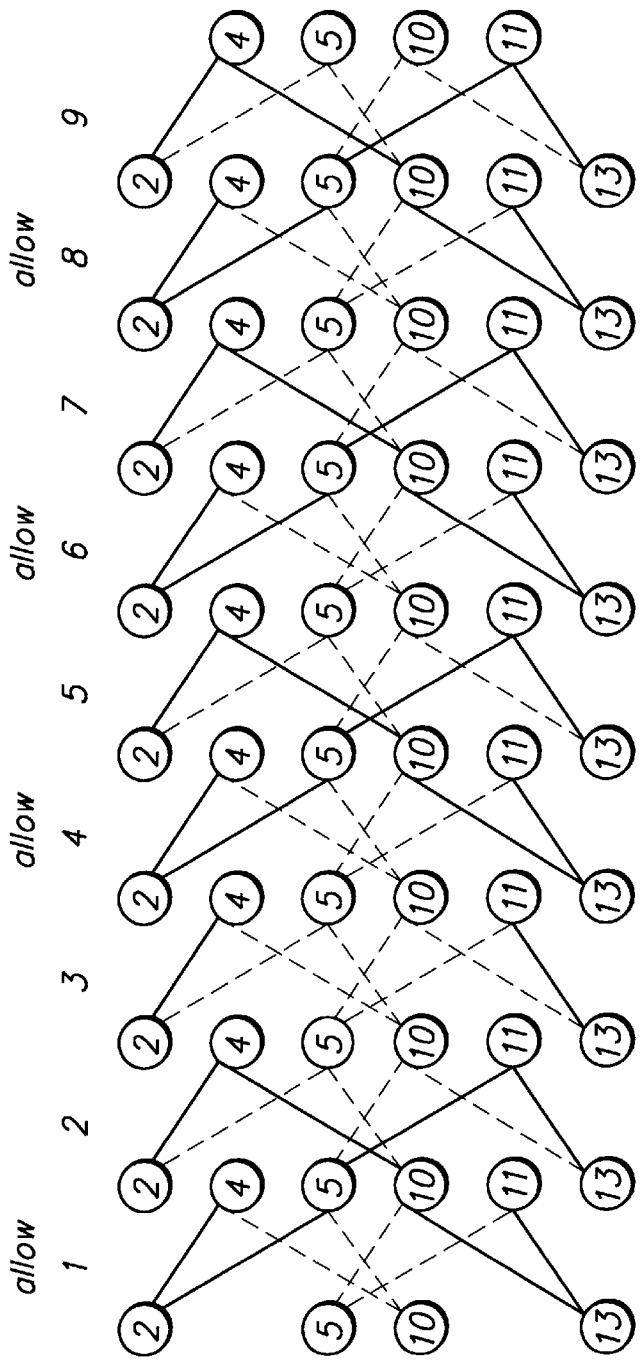
FIG. 7 is a time-varying part of a 16-state detector trellis for the FIG. 6 rate 8/9 time-varying MTR block code.

FIG. 7 shows a partial diagram of a time-varying trellis for a 9-bit code word. Only a few of the states and transitions are shown in FIG. 7 to simplify the diagram. The remainder of the trellis is not time-varying and is not effected by the time-varying MTR code. Three transitions in a row can end in trellis depths 1, 4, 6 and 8. The dashed lines in FIG. 7 indicate state transitions that are not permitted.

Assuming that a 4-bit counter starts with 1 and goes to 9 synchronous with the code word boundary, the selection circuits for states 4 and 11 are overridden when the count is 1, 3, 4, 6 and 8, so that the survivor path to state 11 is from state 13.

Another example of a state transition matrix for a TMTR constraint is given as Equation 5, below. Equation 5 shows that the +−+ error-event can be removed by forbidding patterns of three consecutive transitions preceded by two or more consecutive non-transitions (001110) and four or more consecutive transitions (1111). The Equation 5 state transition matrix has a Shannon capacity of C=0.9132.

$$\begin{bmatrix} 01001 \\ 01100 \\ 10010 \\ 10000 \\ 10100 \end{bmatrix} \quad (5)$$

A further example of a state transition matrix for a TMTR constraint in accordance with the present invention is given as Equation 6, below.

Equation 6 implements a constraint graph which removes the +−+ error event by forbidding patterns of three consecutive transitions followed by an even number of non-transitions (e.g 0111<u>00</u>1, where there are <u>two</u> non-transitions following the three consecutive transitions) and four or more consecutive transitions (1111). The Equation 6 state transition matrix has a Shannon capacity of C =0.9255.

$$\begin{bmatrix} 11000 \\ 10100 \\ 10010 \\ 00001 \\ 01010 \end{bmatrix} \quad (6)$$

One more example of a state transition matrix for a TMTR constraint in accordance with the present invention is given as Equation 7, below. Equation 7 implements a constraint graph which removes the +−+ error-event by forbidding patterns of three consecutive transitions preceded by a transition and an even number of consecutive non-transitions (e.g. 1<u>00</u>1110, where the three transitions are preceded by <u>two</u> non-transitions) and four or more consecutive transitions (1111). The Shannon capacity for this code is C=0.9255.

$$\begin{bmatrix} 0200 \\ 1010 \\ 1001 \\ 1000 \end{bmatrix} \quad (7)$$

Those skilled in the art will appreciate that the present invention may be applied to channels that are matched to lower densities by including an interleave constraint. Partial response channels such as PR4 and EPR4 have dominant error-events such that errors fall on every other channel symbol. The length of the error-event must be limited by the modulation code.

A rate 8/9 (0, G=13, I=9) TMTR code that has two encoder states and is block-decodable that follows the Equation 7 state transition matrix was found. The exemplary rate 8/9 (0, G=13, I=9) code forbids four consecutive transitions and allows up to three consecutive transitions if there was an even number of non-transitions preceding the three transitions in a row, where the number of transitions is counted from either the last preceding transition or the code word boundary, whichever is closer.

Figure 8:
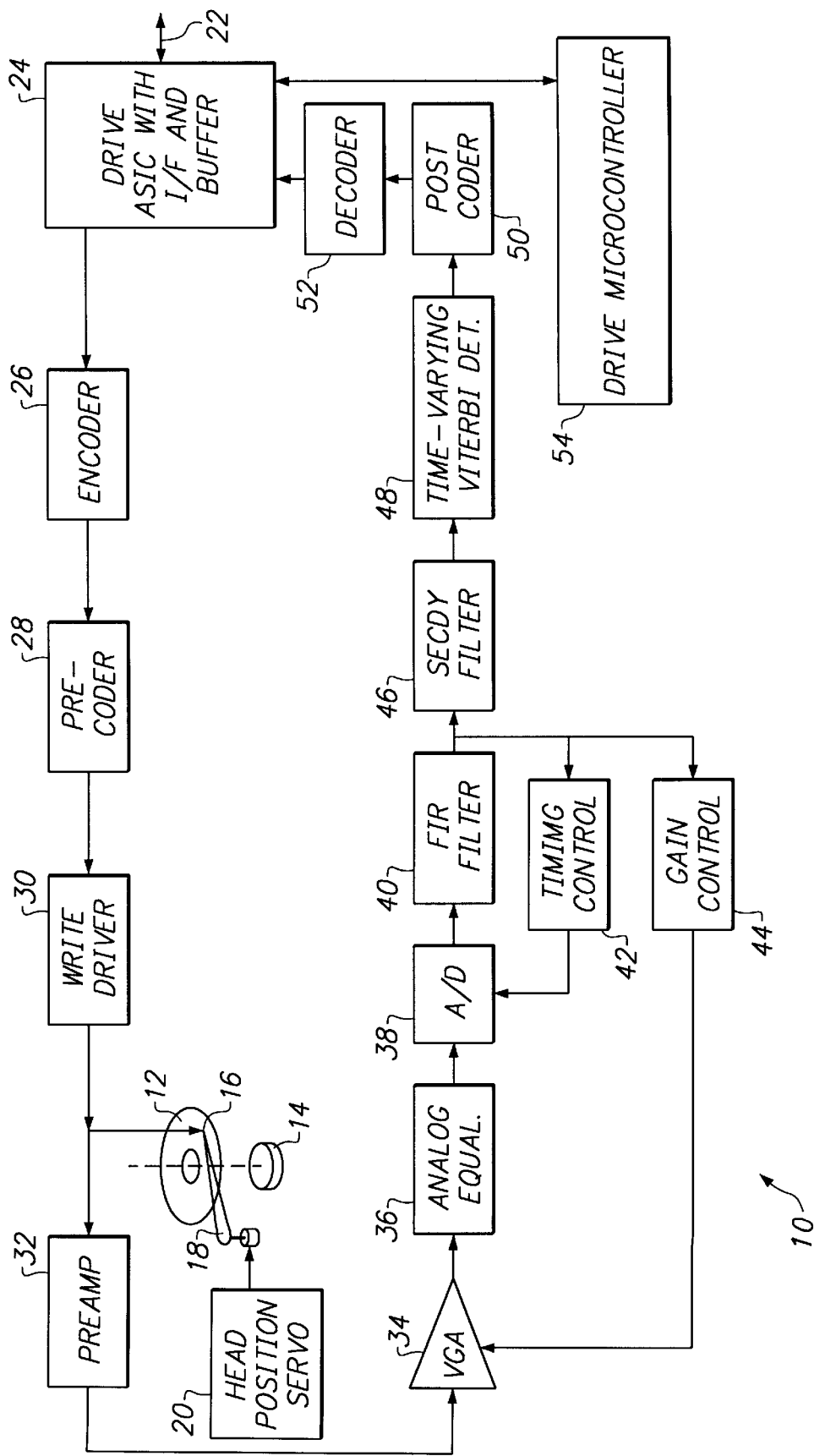
FIG. 8 is a simplified block diagram of a high transition rate magnetic recording channel employing the time-varying MTR block code in accordance with the present invention.

FIG. 8 presents in summary fashion a magnetic recording/playback data channel architecture implementing TMTR codes in accordance with the present invention. In this example, the system is a hard disk drive 10, although other recording/playback devices and channels are clearly within the scope of the present invention. The disk drive 10 includes at least one data storage disk 12 which is rotated at a desired velocity by a spindle motor 14. A write element of a data transducer head 16 writes magnetic flux transitions onto a facing storage surface of the disk 12 during data writing operations, while a read element of the head 16, such as a magneto-resistive element, senses recorded flux transitions and provides a playback signal during data reading operations. As shown, the disk drive 10 employs "flying head" or "Winchester" technology in order to achieve a high linear data density.

The head 16 is positioned over circular tracks on the data surface by e.g. a rotary voice coil actuator structure 18, operating under control of a head position servo 20. An interface 22 connects the disk drive 10 to an external data handling environment, such as a computer, or server. An application-specific integrated circuit 24 combines disk drive data handling and buffering functions. The encoder 26 encodes the data blocks received from the ASIC 24 in accordance with a preferred TMTR block code, e.g. Table 1. A precoder 28 (preferably within the encoder 26) then precodes the encoded data in accordance with e.g. 1/(1+D) (mod 2). The encoded/precoded data is then converted into a magnetic write current within a write driver 30 which also applies write precompensation. The write current sequence is then converted into magnetic fields by the write element of the head 16 and results in flux transitions being written onto a magnetic data storage medium of the data storage surface of the disk 12.

The logic of the encoder 26 implementing the rate 8/9 (d=0, k=11) TMTR block code is implemented in accordance with the Verilog program listing appended hereto as Table 2. In this regard it should be noted that the listing will generate a list of code words for a maximum run length transition code with rate 8/9 (d=0, k=11) block code for use with the 1/(1+D)(mod 2) precoder 28. In the resultant code there are at most:

five consecutive zeros at the start of a nine-bit code word;

six consecutive zeros at the end of a nine-bit code word;

seven consecutive zeros within a nine-bit code word;

a single one at the start of a nine-bit code word; and two consecutive ones at the end of a nine-bit code word.

During playback operations, the read element of the head 16 converts the recorded flux transitions passing beneath the head into minute electrical signals. These signals are preamplified by a preamplifier 32 and controllably amplified by a variable gain amplifier 34. The signals are then equalized and filtered by an analog equalizer 36 and converted into digital sample values by an analog to digital converter 38. A finite-impulse-response (FIR) filter 40 filters and conditions the samples to match a desired spectrum. A timing control loop 42 establishes and maintains sampling intervals for the A/D 38, while a gain control loop 44 normalizes channel gain level at the VGA 34. A secondary filter 46 may also be provided for further channel equalization.

A time-varying Viterbi detector 48 receives the equalized digital samples, and in accordance with principles of the present invention, determines most likely sequences based upon an internal path memory and the coding convention. The Viterbi detector 48 includes the 16 state time-varying trellis, in part described in the FIG. 7 diagram. A postcoder function 50 (preferably within decoder 52) provides a post coding operation as an inverse of the preceding operation provided by the precoder 28.

Decoder 52 decodes the code words into binary sequences which are received and stored in the drive ASIC buffer 24 and then passed to the requesting external device via interface bus structure 22. A Verilog program listing implementing a decoder 52 for the rate 8/9 (d=0, k=11) TMTR block code is appended hereto as Table 3.

An embedded drive microcontroller 54 supervises and coordinates the functions of the disk drive 10 in conventional fashion. The internal address/data and control bus structures within the disk drive 10 are omitted as unnecessary to the present discussion, but they would be present in an actual disk drive.

Another preferred embodiment is presented to implement the rate 8/9 (0, G=13, I=9) TMTR code. A Verilog program listing is appended hereto as Table 4 and implements an encoder in accordance with the preferred rate 8/9 (0, G=13, I=9) TMTR code. A Verilog program listing implementing a decoder for the rate 8/9 (0, G=13, I=9) TMTR code is appended hereto as Table 5. In this second example the time varying Viterbi detector keeps track of a running constraint that counts the number of non-transitions preceding three adjacent transitions. Thus, it will be appreciated by those skilled in the art that a new type of modulation code for high density magnetic recording, called time-varying maximum transition run (TMTR) codes are realized by the present invention. While TMTR and MTR codes eliminate the dominant error-event in high density magnetic recording channels, the TMTR codes have higher coding gain than the MTR codes, because of the higher rates. The rate 8/9 (d=0, k=11) TMTR code is presently preferred over the prior codes. For example, this preferred code has a five percent higher rate than the prior rate 16/19 (d=0, k=7) MTR block code described by Moon and Brickner, discussed above. By high density magnetic recording is meant 2.5 or higher number of data bits per magnetic pulse width measured at half-amplitude (2.5≧PW50/T).

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. A data channel implementing a time-varying maximal-transition-run code that allows up to three consecutive transitions while removing a plus-minus-plus error-event and which does not permit four or more consecutive transitions wherein the block code has a state transition matrix of:

$$\begin{bmatrix} 0011 \\ 0010 \\ 2000 \\ 1100 \end{bmatrix}.$$

2. A data channel implementing a time-varying maximal-transition-run code that allows up to three consecutive transitions while removing a plus-minus-plus error-event and which does not permit four or more consecutive transitions wherein the block code has a state transition matrix of:

$$\begin{bmatrix} 0011000 \\ 0010000 \\ 0000110 \\ 0000101 \\ 2000000 \\ 1100000 \\ 1000000 \end{bmatrix}.$$

3. A data channel implementing a time-varying maximal-transition-run code that allows up to three consecutive transitions while removing a plus-minus-plus error-event and which does not permit four or more consecutive transitions wherein code has a state transition matrix of:

$$\begin{bmatrix} 0110000000000000 \\ 0002000000000000 \\ 0001000000000000 \\ 0000110000000000 \\ 0000002000000000 \\ 0000001100000000 \\ 0000000011000000 \\ 0000000010000000 \\ 0000000000200000 \\ 0000000000110000 \\ 0000000000001100 \\ 0000000000001000 \\ 0000000000000020 \\ 0000000000000011 \\ 2000000000000000 \\ 1000000000000000 \end{bmatrix}.$$

4. The data channel set forth in claim 3 wherein the code is a rate 8/9 block code with a (d=0, k=11) constraint.

5. The data channel set forth in claim 4 wherein within the block code there are at most:
 five consecutive zeros at the start of a nine-bit code word,
 six consecutive zeros at the end of a nine-bit code word,
 seven consecutive zeros within a nine-bit code word,
 a single one at the start of a nine-bit code word, and
 two consecutive ones at the end at the end of a nine-bit code word,
 wherein a zero represents absence of a flux transition within a bit cell, and
 a one represents presence of a flux transition within a bit cell.

6. A data channel implementing a time-varying maximal-transition-run code that allows up to three consecutive transitions while removing a plus-minus-plus error-event and which does not permit four or more consecutive transitions wherein the block code has a state transition matrix of:

$$\begin{bmatrix} 01001 \\ 01100 \\ 10010 \\ 10000 \\ 10100 \end{bmatrix}.$$

7. A data channel implementing a time-varying maximal-transition-run code that allows up to three consecutive transitions while removing a plus-minus-plus error-event and which does not permit four or more consecutive transitions wherein the block code has a state transition matrix of:

$$\begin{bmatrix} 11000 \\ 10100 \\ 10010 \\ 00001 \\ 01010 \end{bmatrix}.$$

8. A data channel implementing a time-varying maximal-transition-run code that allows up to three consecutive transitions while removing a plus-minus-plus error-event and which does not permit four or more consecutive transitions wherein the code has a state transition matrix of:

$$\begin{bmatrix} 0200 \\ 1010 \\ 1001 \\ 1000 \end{bmatrix}.$$

9. The data channel set forth in claim 8 wherein the code is a rate 8/9 code with constraint (d=0, G=13, I=9).

10. A magnetic recording channel including:
   an encoder for encoding a binary data block to be recorded into encoded data code words in accordance with a predetermined time-varying maximal-transition-run code that allows up to three consecutive magnetic flux transitions while removing a plus-minus-plus error-event and which does not allow four or more consecutive magnetic flux transitions,
   a write driver for converting encoded data code words into a write current, and
   a write element for converting the write current into a flux pattern on a magnetic storage medium moving relatively to the write element.

11. The magnetic recording channel set forth in claim 10 further comprising:
   a playback element for detecting the flux pattern on the magnetic storage medium as a minute electrical signal,
   an analog read channel for amplifying an equalizing to a desired spectrum the minute electrical signal to provide an amplified electrical signal,
   a sampler for synchronously sampling the amplified electrical signal to produce discrete data samples,
   a time varying detector for detecting maximum likelihood code sequences from the discrete data samples in accordance with an inverse of the predetermined time-varying maximal-transition-run code,
   and a decoder for decoding the sequences into a play back sequence of the binary data block.

12. The magnetic recording channel set forth in claim 10 wherein the predetermined time-varying maximal-transition-run code is a rate 8/9 block code.

13. The magnetic recording channel set forth in claim 12 wherein the rate 8/9 block code has constraint (d=0, k=11).

14. The magnetic recording channel set forth in claim 12 wherein the rate 8/9 block code has constraint (d=0, G=13, I=9).

15. The data channel set forth in claim 1 wherein the channel comprises a magnetic data storage and retrieval channel.

16. The data channel set forth in claim 2 wherein the channel comprises a magnetic data storage and retrieval channel.

17. The data channel set forth in claim 3 wherein the channel comprises a magnetic data storage and retrieval channel.

18. The data channel set forth in claim 6 wherein the channel comprises a magnetic data storage and retrieval channel.

19. The data channel set forth in claim 7 wherein the channel comprises a magnetic data storage and retrieval channel.

20. The data channel set forth in claim 8 wherein the channel comprises a magnetic data storage and retrieval channel.

* * * * *